United States Patent [19]
Kim et al.

[11] Patent Number: 6,039,804
[45] Date of Patent: Mar. 21, 2000

[54] CRYSTALLIZATION TRAY

[75] Inventors: Hidong Kim; Lansing Joseph Stewart, both of Bainbridge Island, Wash.

[73] Assignee: Emerald BioStructures, Inc., Bainbridge Island, Wash.

[21] Appl. No.: 09/150,629

[22] Filed: Sep. 9, 1998

[51] Int. Cl.[7] .................................................. C30B 35/00
[52] U.S. Cl. .................... 117/206; 117/901; 117/927; 422/56; 422/102; 422/245.1; 422/948; D24/224; D24/226
[58] Field of Search .............................. 117/206, 70, 927, 117/901; D24/224, 223, 226; 422/56, 99, 102, 254, 245.1, 948

[56] References Cited

U.S. PATENT DOCUMENTS 5,130,105  7/1992  Carter et al. ............................ 422/215

OTHER PUBLICATIONS

Hampton Research, 27632 El Lazo Road, Suite 100, Laguna Niguel, CA 92677–3913, "Crystallization Research Tools", vol. 8, No. 2, pp. 30–33, (1998).
Charles Supper Company, 15 Tech Circle, Natick, MA 01760, "Instruments and Supplies for X–Ray Crystallography", MVD/24 Crystal Growth Chamber.

Primary Examiner—Benjamin L. Utech
Assistant Examiner—Donald L. Champagne
Attorney, Agent, or Firm—Christensen O'Connor Johnson & Kindness PLLC

[57] ABSTRACT

The present invention provides a crystallization unit including a solvent reservoir in gaseous communication with a plurality of chambers. Preferably, a plurality of crystallization units are arrayed in the form of a crystallization tray. A first preferred embodiment of the present invention provides a crystallization tray 10 including a rectangular array of crystallization units 26. Each crystallization unit includes a central reservoir 28 and four drop chambers 32 arranged in a cruciform configuration around central reservoir 28. Each drop chamber 32 is connected to central reservoir 28 by a diffusion channel 30. Each drop chamber 32 also includes a shoulder which is capable of supporting a cover slip from which a drop of solution, containing the substance to be crystallized, can be suspended. A second preferred embodiment of the present invention is identical to the first preferred embodiment except that central reservoir 28 is divided into four equal sections by dividers extending vertically from the bottom of central reservoir 28.

22 Claims, 4 Drawing Sheets

CRYSTALLIZATION TRAY

FIELD OF THE INVENTION

This invention relates to crystallization of molecules, in particular to trays useful for testing a large number of crystallization conditions.

BACKGROUND OF THE INVENTION

Macromolecular X-ray crystallography is an essential tool in modern drug discovery and molecular biology. Using X-ray crystallographic techniques, the three-dimensional structures of biological macromolecules, such as proteins, nucleic acids, and their various complexes, can be determined at practically atomic-level resolution from X-ray diffraction data.

One of the first and most important steps in the X-ray crystal structure determination of a target macromolecule is to grow large, well-diffracting crystals of the macromolecule. As the techniques for collecting and analyzing X-ray diffraction data have become more rapid and automated, crystal growth has become a rate-limiting step in the structure determination process.

Vapor diffusion is the most widely used technique for crystallization in modern macromolecular X-ray crystallography. In this technique, a small volume of the macromolecule sample is mixed with an approximately equal volume of a crystallization solution. The resulting drop of liquid (containing macromolecule and dilute crystallization solution) is sealed in a chamber with a much larger reservoir volume of the crystallization solution. The drop is kept separate from the reservoir of crystallization solvent either by hanging the drop from a glass cover slip or by sitting the drop on a pedestal above the level of the solvent in the reservoir. Over time, the crystallization drop and the reservoir solutions equilibrate via vapor diffusion of volatile chemical species. Supersaturating concentrations of the macromolecule are achieved, resulting in crystallization of the macromolecule sample in the drop.

The process of growing biological macromolecule crystals remains, however, a highly empirical process. Macromolecular crystallization is dependent on a host of experimental parameters, including; pH, temperature, the concentration of salts in the crystallization drop, the concentration of the macromolecule to be crystallized, and the concentration of the precipitating agent (of which there are hundreds). In particular, the choice of solute conditions in which to grow crystals continues to be a matter for empirical determination. Testing numerous combinations of variables that affect crystal growth, by means of thousands of crystallization trials, eventually leads to the optimal conditions for crystal growth. Consequently, the ability to rapidly and easily generate many crystallization trials is important in determining the ideal conditions for crystallization. Thus, there is a need for a device that permits the efficient testing of numerous combinations of parameters that affect crystal growth.

SUMMARY OF THE INVENTION

In accordance with the foregoing, the present invention provides a crystallization unit including a central reservoir in gaseous communication with at least one drop chamber. The crystallization unit preferably includes a central reservoir linked to at least one drop chamber by a diffusion channel. Most preferably the central reservoir is linked by four diffusion channels to four drop chambers arranged in a cruciform configuration around the central reservoir. Each drop chamber preferably includes an inwardly-projecting shoulder which is capable of supporting a removable cover slip from which a drop of solution, containing the substance to be crystallized, can be suspended. The crystallization unit also optionally includes a removable cover slip, preferably a removable, tabbed cover slip, that is positionable over at least a portion of the central reservoir. The tabs support the removable cover slip over the central reservoir. The removable cover slip that is positionable over the central reservoir optionally includes at least one graticule. Optionally, the central reservoir includes a divider which is preferably disposed vertically within the central reservoir and divides the central reservoir into at least two sections. Preferably, a plurality of crystallization units are arrayed in the form of a crystallization tray.

A first preferred embodiment of the present invention provides a crystallization tray including a rectangular array of crystallization units. Each crystallization unit includes a central solution reservoir and four drop chambers arranged in a cruciform configuration around the central reservoir. Each drop chamber is connected to the central reservoir by a diffusion channel. The central reservoir, the drop chambers and the diffusion channels each open onto the upper surface of the crystallization tray. Each drop chamber also includes a shoulder which is capable of supporting a cover slip from which a drop of solution, containing the substance to be crystallized, can be suspended. A lid may optionally be placed over the whole crystallization tray.

In operation, solvent is placed in the central reservoir and a drop of solvent containing at least one, dissolved substance that is to be crystallized is placed on the bottom of each drop chamber. Alternatively, a drop of solvent containing at least one, dissolved substance that is to be crystallized can be placed on a cover slip which is inverted and inserted into a drop chamber and supported therein by the shoulder extending around the inner circumference of the drop chamber. In this configuration, the drop hangs down from the coverslip into the drop chamber. Further, a drop of solvent, containing at least one, dissolved substance that is to be crystallized, can be placed on a cover slip which is inserted into a drop chamber without inverting the cover slip, in order to achieve a sitting drop crystallization. Once a drop is placed within some or all of the drop chambers, the upper portion of the crystallization unit, that opens onto the upper surface of the tray, can be sealed, preferably with a clear, adhesive tape. A lid may optionally be placed over the whole crystallization tray. Over time, the drop of solution in the drop chamber and the solvent in the central reservoir equilibrate by vapor diffusion of volatile chemical species through the diffusion channel. Crystallization occurs when a supersaturated solution of the substance to be crystallized is achieved. Thus, each crystallization unit, including four drop chambers, permits up to four different crystallization parameters to be simultaneously tested, while ensuring that each of the four crystallization drops are held in exactly the same vapor diffusion environment. Further, vapor diffusion for any one of the four drop chambers can be terminated by deposition of a vapor-impermeable material, such as petroleum jelly, in the diffusion channel that connects the reservoir to the drop chamber, without disturbing the progress of the vapor diffusion in the other drop chambers.

Additionally, a coverslip, preferably including at least one tab, can be placed over each crystallization unit. A drop of solvent, containing at least one, dissolved substance to be crystallized, is placed on the coverslip which is then located over the central reservoir so that the drop of solvent is suspended from the coverslip and hangs down into the central reservoir. The tabs are seated within the diffusion channels and support the coverslip over the crystallization unit. The coverslip can optionally include at least one graticule.

A second preferred embodiment of the present invention is identical to the first preferred embodiment except that the central reservoir is divided into four equal sections by at least one divider extending vertically from the bottom of the reservoir. Each of the four reservoir sections is linked to a drop chamber by a diffusion channel.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
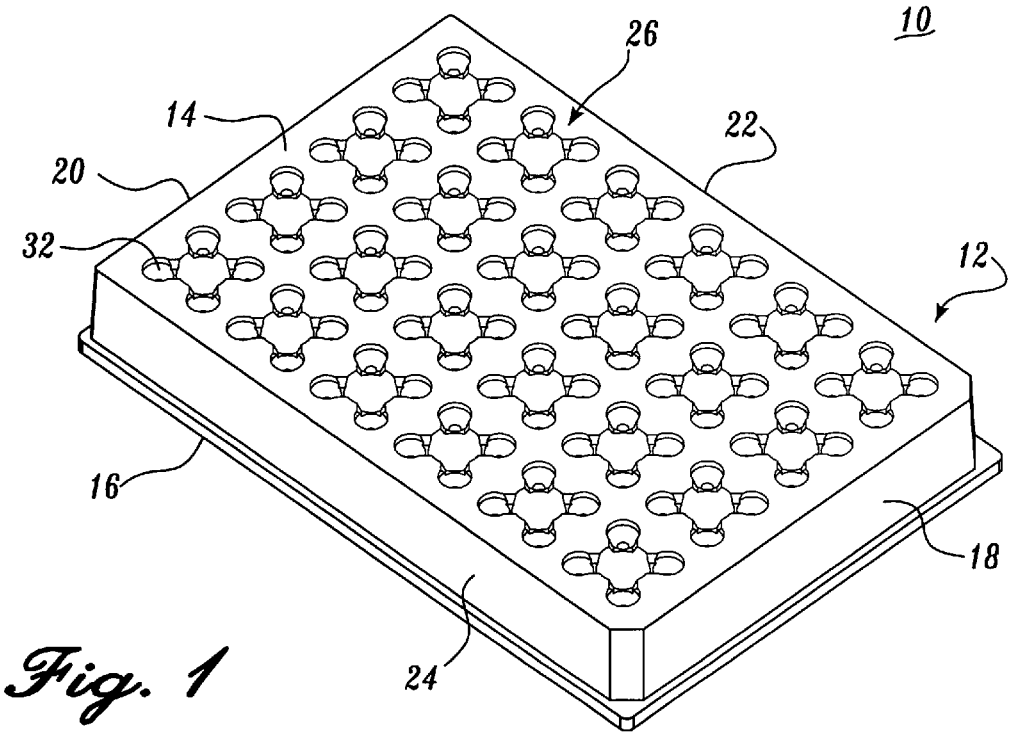
FIG. 1 is a three dimensional view of the first preferred embodiment of the present invention in which a plurality of crystallization units are arrayed in the form of a rectangular crystallization tray.

The present invention provides a crystallization unit including a central reservoir in gaseous communication with at least one drop chamber. Each drop chamber includes a shoulder that extends around the circumference of the inner surface of the drop chamber and which is capable of supporting a cover slip. Each drop chamber is connected, directly or indirectly, to a central reservoir by a diffusion channel. The central reservoir of a crystallization unit may be divided into a plurality of sections by one or more vertical dividers. Each section is connected, directly or indirectly, to a drop chamber by a diffusion channel. Preferably a plurality of crystallization units are arrayed together in the form of a crystallization tray. The central reservoir, drop chamber(s) and diffusion channel(s) of each crystallization unit open onto the upper surface of the crystallization tray. A tabbed coverslip may be placed over a crystallization unit with the tabs being seated within the diffusion channels.

The present invention can be used to crystallize any crystallizable substance, but the present invention is especially useful in crystallizing biological macromolecules such as proteins and nucleic acids. In particular, the present invention is especially useful in the field of structure-based drug design. The great utility of X-ray crystallography in structure-based drug design is in elucidating the binding modes of novel, pharmacologically-active compounds, i.e. to elucidate the structure of the complex formed when a drug binds to the receptor through which it mediates its biological effect(s). This three-dimensional structural information is used to optimize the structural design of novel drugs that bind more efficiently and/or selectively to a target receptor, and to create the next generation of compounds derived therefrom. The crystallizability of a target receptor is sensitive to the binding of ligands. Different ligand complexes of a particular target receptor may crystallize under different conditions, or receptor-ligand complexes may crystallize under the same conditions, but with different crystal forms. Consequently, it is important to be able to rapidly and efficiently test numerous combinations of factors that might affect the crystallization of a receptor and its ligand(s).

With reference to FIGS. 1 to 5, the first preferred embodiment of the present invention is a crystallization tray 10 that includes a body 12 having an upper surface 14, a lower surface 16, a first end 18, a second end 20, a first side 22 and a second side 24. Body 12 defines a plurality of crystallization units 26. Each crystallization unit 26 includes a central reservoir 28, four diffusion channels 30 and four drop chambers 32. Each drop chamber 32 is connected to central reservoir 28 by one diffusion channel 30. As shown more clearly in FIG. 3, central reservoir 28 includes a lower surface 34, an upper portion 36 and a lower portion 38, and is generally cylindrical in shape. Upper portion 36 of central reservoir 28 opens onto upper surface 14 of body 12.

Figure 3:
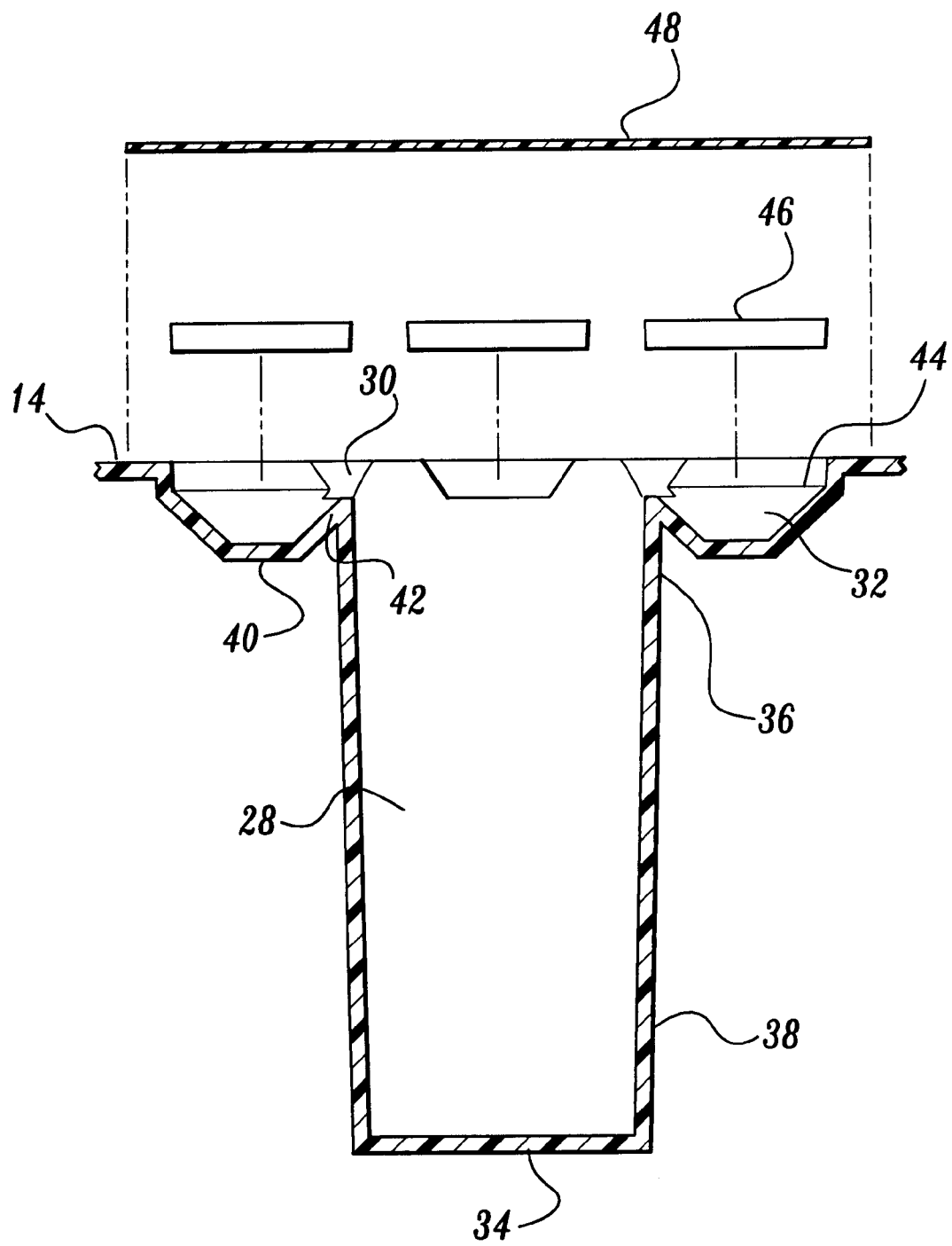
FIG. 3 is a cross-section of a crystallization unit of the first preferred embodiment of the present invention.

Also as shown more clearly in FIG. 3, drop chamber 32 is generally cup-shaped when viewed in cross-section and includes a flat lower surface 40, and an upper portion 42. Upper portion 42 of drop chamber 32 opens onto upper surface 14 of body 12. The inner circumference of drop chamber 32 defines a shoulder 44 which is capable of supporting a cover slip 46. Cover slip 46 is preferably round and can be constructed from any optically transparent, rigid material, such as glass or clarified polypropylene. Preferably cover slip 46 has a thickness of from about 1 mm to about 2 mm. A diffusion channel 30 extends from upper portion 36 of central reservoir 28 to upper portion 42 of each drop chamber 32. Diffusion channels 30 are generally trapezoidal in shape when viewed in transverse cross-section and open onto upper surface 14 of body 12.

Figure 2:
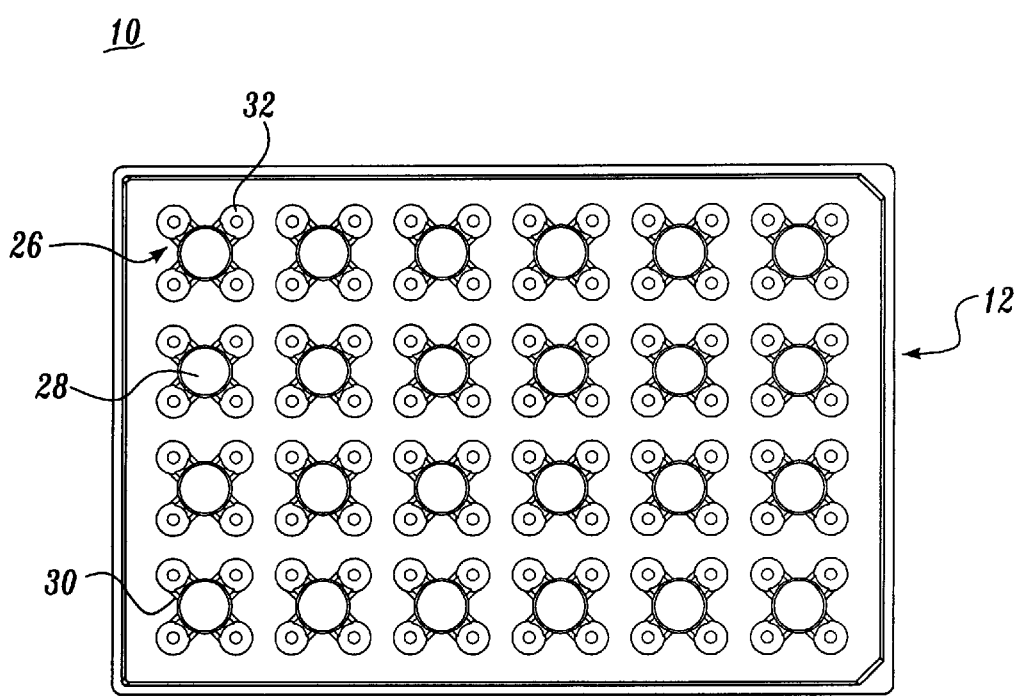
FIG. 2 is a view of the upper surface of the first preferred embodiment of the present invention in which a plurality of crystallization units are arrayed in the form of a rectangular crystallization tray.

In operation, liquid solvent is placed in central reservoir 28, and a drop of a solution containing the substance to be crystallized is placed on lower surface 40 of drop chamber 32. Alternatively, hanging drop crystallization can be achieved by applying a drop of solution containing the substance to be crystallized to cover slip 46 which is inserted into drop chamber 32 where it is supported by shoulder 44. The drop of solution containing the substance to be crystallized is thus suspended from cover slip 46 and hangs down into drop chamber 32. Once a drop of the solution containing the substance to be crystallized is placed within one or more drop chamber(s) 32, drop chamber(s) 32 can be sealed by applying a sealant, preferably a transparent, adhesive tape, across upper portion 42 of drop chamber 32 that opens onto upper surface 14 of body 12. Preferably all drop chambers 32 within crystallization unit 26 are sealed together with a single piece of transparent tape applied to upper surface 14 of body 12 so that it seals crystallization unit 26. Where, as shown in FIGS. 1 and 2, a plurality of crystallization units 26 are arrayed in the form of a crystallization tray 10, each crystallization unit 26 can be sealed independently of the other crystallization units 26, or all crystallization units 26 can be sealed together. A lid 48 may optionally be placed over upper surface 14 of body 12.

Once crystallization unit 26 has been sealed, the drop of solution containing the substance to be crystallized, and the solvent within central reservoir 28 equilibrate by vapor diffusion of volatile chemical species that move between drop chamber 32 and central reservoir 28 through diffusion channel 30. Each of the drops in the four drop chambers 32 of an individual crystallization unit 26 are maintained in exactly the same vapor diffusive environment, provided that volatile solvent is free to diffuse through diffusion channels 30 to each drop chamber 32. Crystallization occurs when a supersaturated solution of the substance to be crystallized is formed.

Since each drop chamber 32 within crystallization unit 26 is linked to central reservoir 28 by its own diffusion channel 30, vapor diffusion between central reservoir 28 and any one of the four drop chambers 32 within crystallization unit 26 can be terminated by deposition of a vapor-impermeable substance in diffusion channel 30, without disturbing the progress of the vapor diffusion in the other drop chambers 32. Further, crystals within an individual drop chamber 32 can be removed or manipulated without disturbing crystals in adjacent drop chambers 32.

Figure 4:
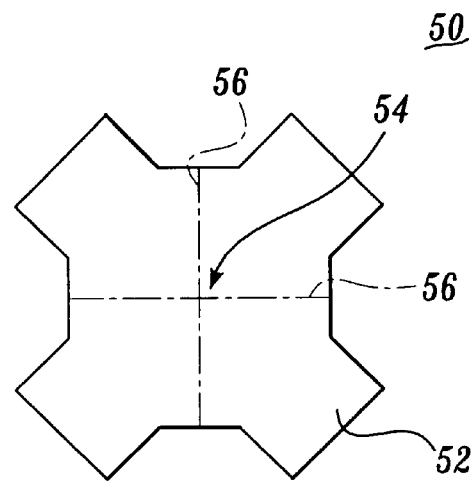
FIG. 4 is a view of a tabbed coverslip that can be utilized with the first preferred embodiment of the present invention.
Figure 5:
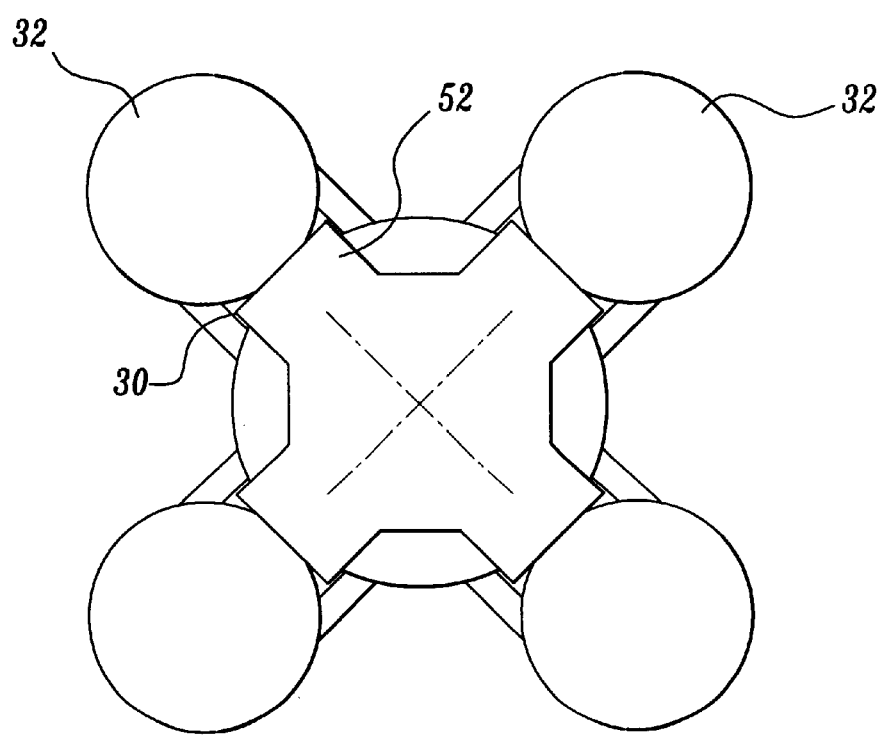
FIG. 5 is a view of the upper surface of a crystallization unit of the first preferred embodiment of the present invention showing a tabbed coverslip located thereon.

As shown in FIGS. 4 AND 5, optionally a tabbed cover slip 50, including at least one tab 52, can be placed over a crystallization unit 26 of crystallization tray 10 of the first preferred embodiment of the present invention. The presently preferred embodiment of tabbed cover slip 50 has a generally square configuration and includes four tabs 52, one tab 52 being located at each corner of cover slip 50. A drop of solvent, containing at least one, dissolved substance to be crystallized, is placed on tabbed cover slip 50 which is then located over central reservoir 28 of crystallization unit 26 so that the drop of solvent is suspended from tabbed cover slip 50 and hangs down into central reservoir 28. As shown more clearly in FIG. 5, tabs 52 are seated within diffusion channels 30 and support tabbed coverslip 50 over crystallization unit 26. In this way, crystals are formed by suspending the drop of solution of the substance to be crystallized within central reservoir 28 containing solvent. Tabbed coverslip 50 can optionally include at least one graticule 54 for measuring crystal size and/or for demarcating portions of tabbed coverslip 50, within each of which a drop of solution containing a substance to be crystallized can be placed. Preferably graticule 54 includes at least one graduated line 56, most preferably a pair of intersecting, graduated lines 56. Although the presently preferred embodiment of tabbed coverslip 50 has a generally square configuration and includes four tabs 52, it will be appreciated that tabbed coverslip 50 can have other configurations, such as circular or triangular. Indeed, a generally square cover slip could be utilized instead of tabbed cover slip 50, with the corners of the square resting in the four diffusion channels 30.

Crystallization tray 10 of the first preferred embodiment of the present invention, which includes a rectangular array of twenty four crystallization units 26, thus permits the user to simultaneously screen up to ninety six different combinations of factors that affect crystallization. Additionally, the number of factors that can be simultaneously tested can be doubled by placing a crystallization drop in each quadrant of a tabbed cover slip 50, i.e., four drops per tabbed cover slip 50, which is placed over central reservoir 28. To further facilitate such large-scale screening efforts, identifying indicia, preferably numbers, can be etched, or otherwise applied, to lower surface 40 of drop chamber 32 and/or to lower surface 34 of central reservoir 28 in order to conveniently identify the composition of the solution(s) therein. Additionally, the dimensions of the identifying indicia, for example the depth of etched indicia, can be used as a reference with which to estimate the size of developing crystals.

It will be appreciated that, although the presently preferred form of crystallization unit 26 has four drop chambers 32 arranged around a central reservoir 28, the number of drop chambers 32 can be varied, as can their geometrical arrangement around central reservoir 28. Thus, for example, crystallization unit 26 can have a generally triangular configuration with central reservoir 28 located at the center of the triangle, and a drop chamber 32 located at each of the three vertices of the triangle. Additionally, for example, drop chambers 32 can be arranged in series. Thus, a first drop chamber 32 can be connected to central reservoir 28 by a diffusion channel 30, a second drop chamber 32 can connected to first drop chamber 32 by a diffusion channel 30, and so on to form a series of linked drop chambers 32 in which only a single drop chamber 32 is directly linked to central reservoir 28. The number of drop chambers 32 in the linked series would be limited by the dimensions of crystallization tray 10.

Figure 6:
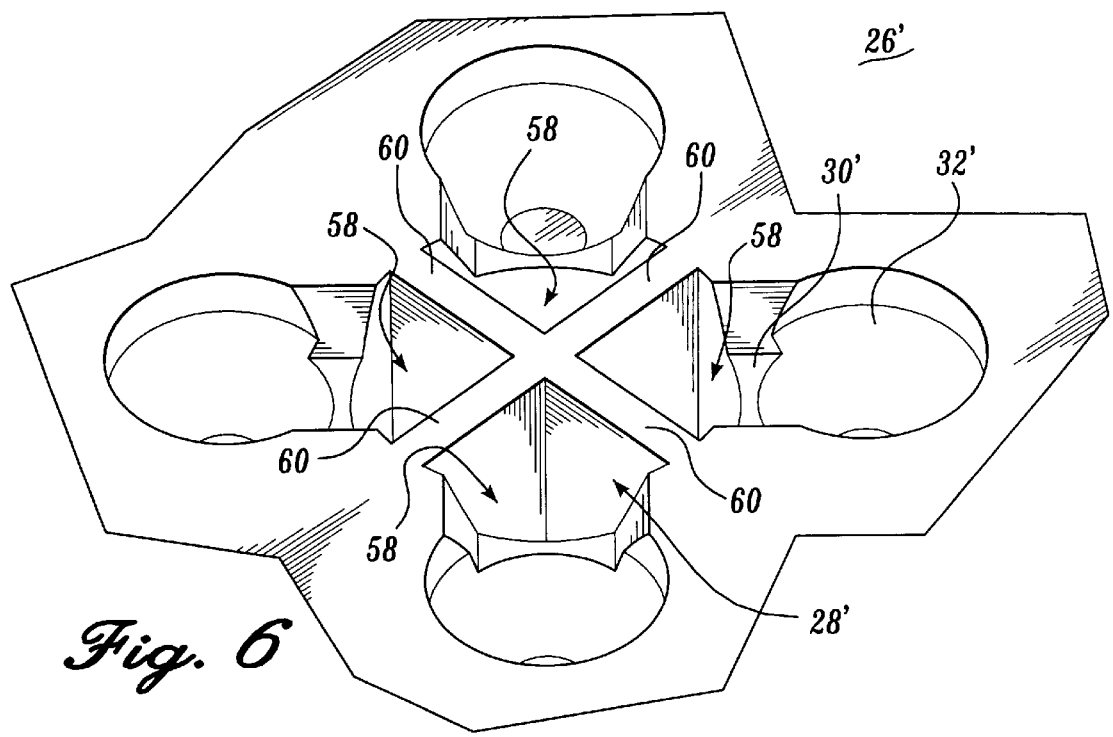
FIG. 6 is a three dimensional view of a crystallization unit of the second preferred embodiment of the present invention showing the dividers extending vertically within the central reservoir.
Figure 7:
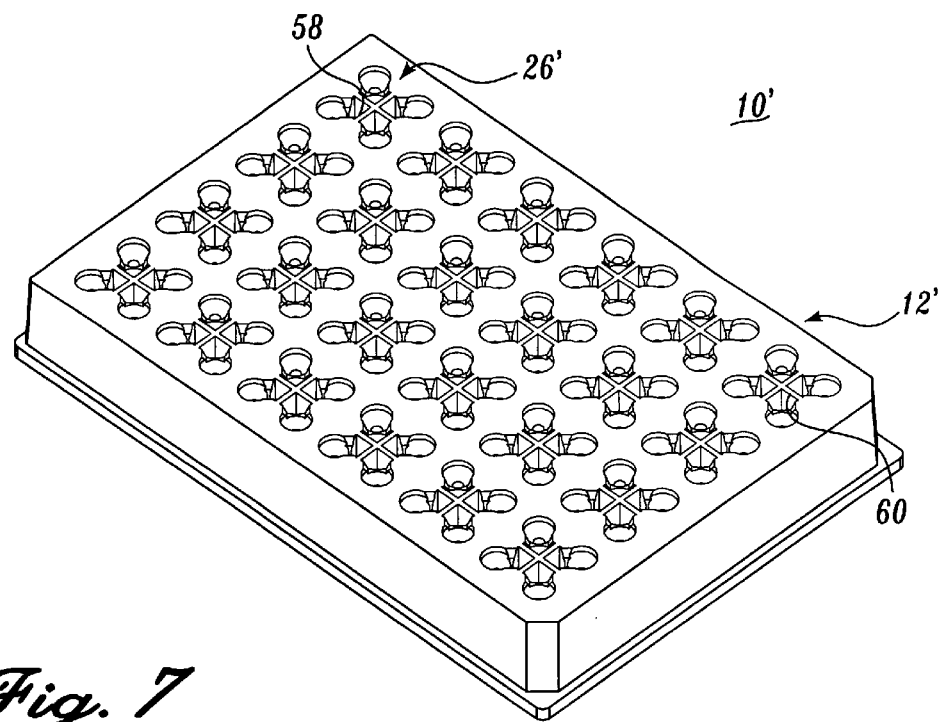
FIG. 7 is a three dimensional view of the second preferred embodiment of the present invention in which the crystallization units are arrayed in the form of a rectangular crystallization tray.

A second preferred embodiment of the present invention is shown in FIGS. 6 and 7. Parts numbers that refer to corresponding parts of crystallization tray 10 of the first preferred embodiment are indicated with a prime ('). The second preferred embodiment of the present invention is a crystallization tray 10' that is identical to crystallization tray 10 of the first preferred embodiment of the present invention, except that central reservoir 28' is divided into four equal sections 58 by dividers 60 that extend vertically from lower surface 34' of central reservoir 28' to upper surface 14' of body 12'. Each reservoir section 58 is connected to a drop chamber 32' by a diffusion channel 30'. Tabbed coverslip 50 cannot be utilized with crystallization tray 10' of the second preferred embodiment of the present invention.

Factors that affect crystallization include, but are not limited to: initial concentration of the substance to be crystallized; chemical structure of the substance to be crystallized; electrical charge of the substance to be crystallized and distribution of that charge within the substance to be crystallized; the solvent used to dissolve the substance to be crystallized; the identity of the precipitating agent dissolved with the substance to be crystallized; the concentration of the precipitating agent dissolved with the substance to be crystallized; the pH of the solution containing the substance to be crystallized; hanging drop versus sitting drop crystallization; identity and concentration of salt dissolved with the substance that is to be crystallized; structure and concentration of a small molecule ligand; use of homogeneous or heterogeneous seed crystals; type of antioxidant utilized (if any); inert gas purges and water-permeable oil overlay.

Thus, by way of non-limiting example, where the substance to be crystallized is a protein that binds an oligopeptide ligand, identical solutions containing the protein and oligopeptide ligand can be placed in every drop chamber 32 of crystallization tray 10 of the first preferred embodiment of the present invention, except that the amino acid sequence of the oligopeptide ligand is different in each drop chamber 32. In this way, the effect of the amino acid sequence of the oligopeptide ligand on the crystallization of the protein-ligand complex can be assessed.

Additionally, by way of non-limiting example, each drop chamber 32' of each crystallization unit 26' of crystallization tray 10' of the second preferred embodiment of the present invention can contain a drop of solution of the substance to be crystallized that is identical to the drop of solution in every other drop chamber 32', except that none of the drops have the same pH. The pH of the reservoir of solvent in each central reservoir section 58 would be the same as the pH of the drop of solution of the substance to be crystallized in drop chamber 32' to which each, individual, central reservoir section 58 is connected. In this way, the effect of pH on the crystallization of the substance under investigation can be assessed.

Further, instead of depositing four different samples of a substance to be crystallized in every drop chamber 32 of a crystallization unit 26, any vapor diffusive reagent, such as dithiothreitol or β-mercaptoethanol, may be deposited in one or more drop chamber 32 to further control and modulate the crystallization process in other drop chambers 32 within the same crystallization unit 26.

Crystallization trays 10 and 10' can be made from any suitable material, but are preferably made from a clear plastic material so that crystal growth can be viewed under a microscope. Further, the material from which crystallization trays 10 and 10' are constructed should preferably be a low-wettability material having a relatively high contact angle with respect to water, so that the solution of the substance to be crystallized will tend to form discrete drops when placed in contact with crystallization trays 10 and 10'. Most preferably crystallization trays 10 and 10' are made from a clear, polypropylene polymer called Opticul™ which is described in O'Leary, R. K. (1997) *Becton Dickinson Technical Bulletin* 411, 1–3.

While the preferred embodiment of the invention has been illustrated and described, it will be appreciated that various changes can be made therein without departing from the spirit and scope of the invention.

What is claimed is:

1. A crystallization unit comprising a reservoir and a plurality of drop chambers disposed around said reservoir, said drop chambers being in gaseous communication with said reservoir.

2. The crystallization unit of claim 1 wherein said reservoir is connected to said drop chambers by a plurality of diffusion channels.

3. The crystallization unit of claim 1 wherein each of said drop chambers further comprises an inwardly-projecting shoulder.

4. The crystallization unit of claim 3 wherein at least one of said drop chambers further comprises a removable cover slip that is supported by said shoulder.

5. The crystallization unit of claim 1 wherein said reservoir further comprises a divider.

6. The crystallization unit of claim 5 wherein said divider is disposed vertically within said reservoir and divides said reservoir into at least two sections.

7. The crystallization unit of claim 1 further comprising a removable cover slip that is positionable over at least a portion of said reservoir.

8. The crystallization unit of claim 7 wherein said removable cover slip further comprises at least one tab for supporting said cover slip over said reservoir.

9. A crystallization tray comprising a plurality of crystallization units, each of said crystallization units comprising a reservoir and a plurality of drop chambers disposed around said reservoir, said drop chambers being in gaseous communication with said reservoir.

10. The tray of claim 9 wherein the reservoir of each crystallization unit is connected to the drop chambers within the same crystallization unit by a plurality of diffusion channels.

11. The tray of claim 9 wherein each drop chamber of each crystallization unit further comprises an inwardly-projecting shoulder.

12. The tray of claim 11 further comprising a removable cover slip that is supported by said inwardly-projecting shoulders.

13. The tray of claim 9 wherein each reservoir further comprises a divider.

14. The tray of claim 13 wherein each divider is disposed vertically within a reservoir and divides each reservoir into at least two sections.

15. The tray of claim 9 further comprising a removable cover slip that is positionable over at least a portion of the reservoir of any one of said plurality of crystallization units.

16. The tray of claim 15 wherein said removable cover slip further comprises at least one tab for supporting said cover slip over the reservoir of any one of said plurality of crystallization units.

17. A crystallization tray comprising a plurality of crystallization units, each of said crystallization units comprising a reservoir, four drop chambers disposed around said reservoir, and four diffusion channels that connect said drop chambers to said reservoir.

18. The crystallization tray of claim 17 wherein said drop chambers are disposed around said reservoir in a cruciform configuration.

19. The crystallization unit of claim 1 comprising four drop chambers disposed around said reservoir.

20. The crystallization unit of claim 19 wherein said four drop chambers are arranged in a cruciform configuration.

21. The crystallization unit of claim 1 comprising three drop chambers disposed around said reservoir.

22. The crystallization tray of claim 9 wherein each of said crystallization units comprises three drop chambers disposed around the reservoir.

* * * * *